US009250612B2

(12) United States Patent
Chou et al.

(10) Patent No.: US 9,250,612 B2
(45) Date of Patent: Feb. 2, 2016

(54) SYSTEM AND METHOD FOR A TIME-TO-DIGITAL CONVERTER

(71) Applicant: Taiwan Semiconductor Manufacturing Company, Ltd., Hsin-Chu (TW)

(72) Inventors: Mao-Hsuan Chou, Xinfeng Township (TW); Jinn-Yeh Chien, Chu Bei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 23 days.

(21) Appl. No.: 14/218,637

(22) Filed: Mar. 18, 2014

(65) Prior Publication Data

US 2015/0268633 A1 Sep. 24, 2015

(51) Int. Cl.
*H03M 1/50* (2006.01)
*G04F 10/00* (2006.01)

(52) U.S. Cl.
CPC .................................... *G04F 10/005* (2013.01)

(58) Field of Classification Search
CPC ....... G04F 10/005; G04F 10/00; G04F 10/04; G04F 10/06; G04F 10/10; H03M 1/12; H03M 1/00
USPC .......................................... 341/166, 110, 157
See application file for complete search history.

(56) References Cited

U.S. PATENT DOCUMENTS

| | | | | |
|---|---|---|---|---|
| 4,335,639 | A * | 6/1982 | Okamoto | 84/618 |
| 5,642,386 | A * | 6/1997 | Rocco, Jr. | 375/355 |
| 6,754,613 | B2 * | 6/2004 | Tabatabaei et al. | 702/189 |
| 6,912,179 | B1 * | 6/2005 | Duke | 368/10 |
| 7,522,084 | B2 * | 4/2009 | Huang et al. | 341/157 |
| 7,589,556 | B1 * | 9/2009 | Tan et al. | 326/40 |
| 8,164,493 | B2 * | 4/2012 | Hsieh | 341/110 |
| 8,754,793 | B2 * | 6/2014 | Henzler | 341/120 |
| 2012/0313803 | A1 * | 12/2012 | Dosho et al. | 341/166 |

* cited by examiner

*Primary Examiner* — Jean B Jeanglaude
(74) *Attorney, Agent, or Firm* — Slater & Matsil, L.L.P.

(57) ABSTRACT

An embodiment is a device including a control circuit, a time-to-digital converter circuit coupled having a first output coupled to a first input of the control circuit, and a gating circuit having a first input coupled to a first signal, a second input coupled to a second signal, and an output coupled to a first input of the time-to-digital converter circuit, an output of the control circuit coupled to a second input of the time-to-digital converter circuit and to a third input of the gating circuit.

20 Claims, 6 Drawing Sheets

SYSTEM AND METHOD FOR A TIME-TO-DIGITAL CONVERTER

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrinking the process node towards the sub-20 nm node).

A shift to all-digital phase-locked loops (ADPLLs) has accompanied the shrinking of the semiconductor process node. The ADPLL replaces analog components of analog PLLs with digital components, and in some cases, adopts a different architecture completely. One component common to many ADPLL architectures is a time-to-digital converter, or TDC. The TDC converts time information to a coded digital signal. This coded digital signal may be input to a digital control oscillator.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
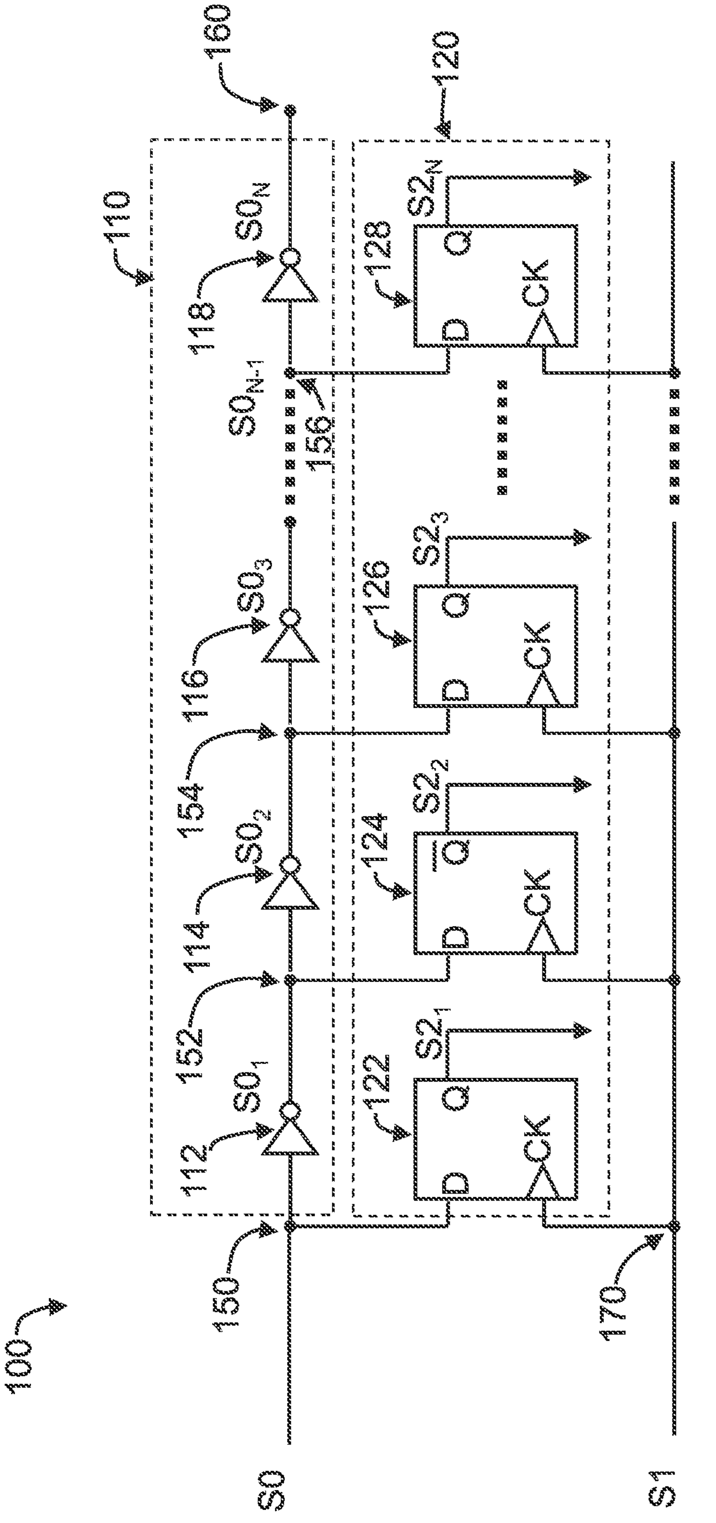
FIG. 1 illustrates a circuit diagram of a TDC system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments will be described with respect to a specific context, namely a power-saving time-to-digital converter (TDC) system. Other embodiments may also be applied, however, to other systems needing to reduce the amount of power required.

FIG. 1 illustrates a circuit diagram of a TDC core 100 in accordance with some embodiments. The TDC core 100 includes at least a delay line 110 and a readout circuit 120. The delay line 110 receives an input signal S0 at a node 150 and outputs output signals $S0_1$, $S0_2$, $S0_1$, . . . $S0_{N-1}$, $S_N$. The readout circuit 120 latches the input signal S0 and the output signals $S0_1$, $S0_2$, $S0_1$, . . . $S0_{N-1}$ synchronously based on an input signal S1 at a node 170. The readout circuit outputs output signals $S2_1$, $S2_2$, $S2_3$, . . . $S2_N$, which can be used, as discussed below, to determine a phase relationship between the input signals S0 and S1. In some embodiments, the input signals S0 and S1 are periodic signals.

The delay line 110 may include an N number of inverters, where N is any integer value greater than zero. For example, the illustrated embodiment includes more than four inverters 112, 114, 116, and 118. The inverter 112 of the delay line 110 has an input coupled to the node 150, and an output coupled to a node 152. The inverter 112 inverts the input signal S0 to generate a signal $S0_1$ having an opposite logic level of the input signal S0. For example, when the input signal S0 is a logic low value, the signal $S0_1$ is a logic high value.

An inverter 114 of the delay line 110 has an input coupled to the node 152, and an output coupled to a node 154. The inverter 114 inverts the input signal $S0_1$ to generate a signal $S0_2$ having an opposite logic level of the input signal $S0_1$. For example, when the input signal $S0_1$ is a logic low value, the signal $S0_2$ is a logic high value.

An inverter 116 of the delay line 110 has an input coupled to the node 154. The inverter 116 inverts the input signal $S0_2$ to generate a signal $S0_3$ having an opposite logic level of the input signal $S0_2$. For example, when the input signal $S0_2$ is a logic low value, the signal $S0_3$ is a logic high value.

An inverter 118 of the delay line 120 has an input coupled to a node 156. The inverter 118 inverts signal $S0_{N-1}$ to generate a signal $S0_N$ having an opposite logic level of the signal $S0_{N-1}$. For example, when the $S_{N-1}$ is a logic high value, the signal $S0_N$ is a logic low value. The number N of the inverters 112, 114, 116, . . . 118 may be designed to achieve an acceptable tradeoff between resolution, area, power consumption, and other desirable circuit performance parameters. Although shown having more than four inverters, embodiments in which the delay line 110 includes fewer than four inverters (e.g., three or two inverters) are also contemplated herein.

A flip-flop 122 of the readout circuit 120 is a D-type flip-flop, and has an input (D), a non-inverting output (Q), and a clock (or, "enable") (CK). The input of the flip-flop 122 is coupled to the node 150. The clock of the flip-flop 122 is coupled to the node 170. The output signal $S2_1$ generated by the flip-flop 122 is read out from the non-inverting output. In some embodiments, the output is read out from an inverting output. In some embodiments, the flip-flop 122 captures the logic level (e.g., "high" or "low") of the input signal S0 at edges (e.g., rising edges) of the input signal S1.

A flip-flop 124 of the readout circuit 120 is a D-type flip-flop, and has an input (D), an inverting output ($\overline{Q}$), and a clock (or, "enable") (CK). The input of the flip-flop 124 is coupled to the node 152. The clock of the flip-flop 124 is coupled to the node 170. The output signal $S2_2$ generated by the flip-flop 124 is read out from the inverting output. In some embodiments, the output is read out from a non-inverting output. In some embodiments, the flip-flop 124 captures the logic level (e.g., "high" or "low") of the signal $S0_1$ at edges (e.g., rising edges) of the input signal S1.

A flip-flop 126 of the readout circuit 120 is a D-type flip-flop, and has an input (D), a non-inverting output (Q), and a clock (or, "enable") (CK). The input of the flip-flop 126 is coupled to the node 154. The clock of the flip-flop 126 is coupled to the node 170. The output signal $S2_3$ generated by the flip-flop 126 is read out from the non-inverting output. In some embodiments, the output is read out from an inverting output. In some embodiments, the flip-flop 126 captures logic level (e.g., "high" or "low") of the second signal $S0_2$ at edges (e.g., rising edges) of the input signal S1.

A flip-flop 128 of the readout circuit 120 is a D-type flip-flop, and has an input (D), a non-inverting output (Q), and a clock (or, "enable") (CK). The input of the flip-flop 128 is coupled to the node 156. The clock of the flip-flop 128 is coupled to the node 170. The output signal $S2_N$ generated by the flip-flop 128 is read out from the non-inverting output. In some embodiments, the output is read out from an inverting output. In some embodiments, the flip-flop 128 captures logic level (e.g., "high" or "low") of the signal $S0_{N-1}$ at edges (e.g., rising edges) of the input signal S1. The number N of the flip-flops 122, 124, 126, . . . 128 may be the same as the number N of the inverters 112, 114, 116, . . . 118. Although shown having more than four flip-flops, embodiments in which the readout circuit 120 includes fewer than four flip-flops (e.g., three or two flip-flops) are also contemplated herein.

Figure 2:
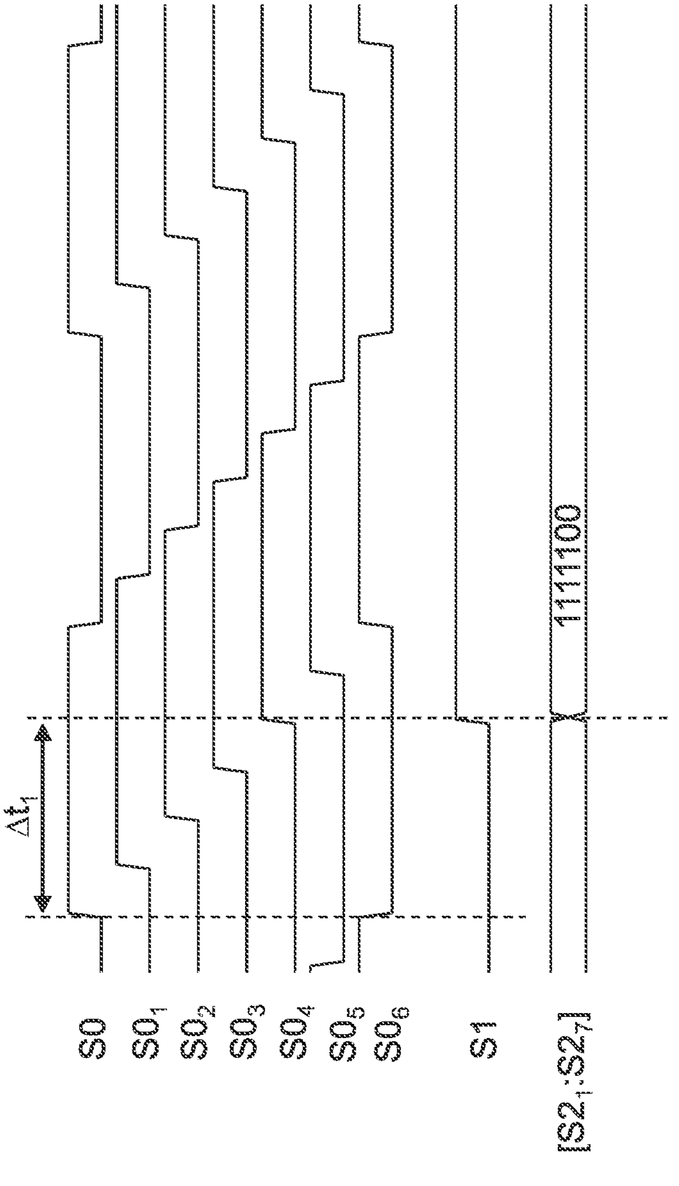
FIG. 2 is a waveform diagram illustrating operation of a TDC system in accordance with some embodiments.

FIG. 2 is a waveform diagram illustrating operation of the TDC core 100 illustrated in FIG. 1 in accordance with some embodiments. In some embodiments, the TDC core 100 is used to determine time information of the input signals S0 and S1. In an embodiment, the time information is a phase relationship between the input signals S0 and S1 illustrated as $\Delta t_1$ in FIG. 2. The TDC core 100 uses the delay line 110 output signals, $S0_1$-$S0_6$, to determine the time information of the input signals S0 and S1. In some embodiments, the output signals $S0_1$-$S0_6$ correspond to the number of inverter delays of the delay line. For example, the output signal $S0_3$ corresponds to three inverter delays, and the output signal $S0_5$ corresponds to five inverter delays. The output signals $S0_1$-$S0_6$ are received by the readout circuit 120, which is clocked by the input signal S1. The readout circuit 120 captures the output signals $S0_1$-$S0_6$ on an edge (e.g., a rising edge) of the input signal S1. The output signals $S2_1$-$S2_7$ of the readout circuit 120 are decoded to determine the time information of the input signals S0 and S1.

As illustrated in FIG. 2, at the rising edge of the input signal S1 (shown by a dotted line), the input signal S0 is at a high value and the delay line output signals $S0_1$, $S0_2$, $S0_3$, and $S0_4$ are also at a high voltage, whereas the delay line output signals $S0_5$ and $S0_6$ are at a low voltage. Hence, in this example, the output signals $S2_1$-$S2_7$ have a decoder string value="1111100".

Figure 3:
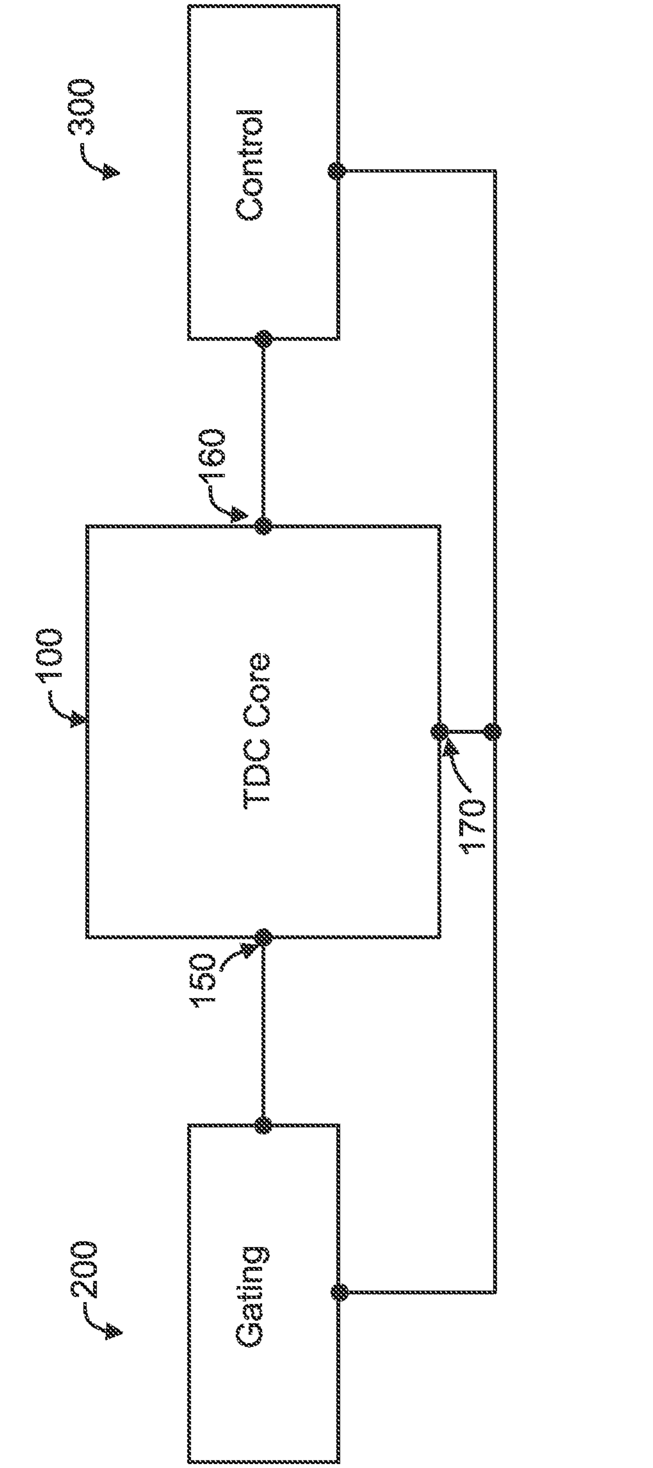
FIG. 3 illustrates a block diagram of a power-saving TDC system in accordance with some embodiments.

FIG. 3 illustrates a block diagram of a power-saving TDC system in accordance with some embodiments. This system includes a gating circuit 200, the TDC core 100 (see FIG. 1), and a control circuit 300. The gating circuit 200 is coupled to the TDC core at nodes 150 and 170 (see FIG. 1) and is coupled to the control circuit 300 at node 170. The control circuit is coupled to the TDC core 100 at nodes 160 and 170 (see FIG. 1).

Figure 4:
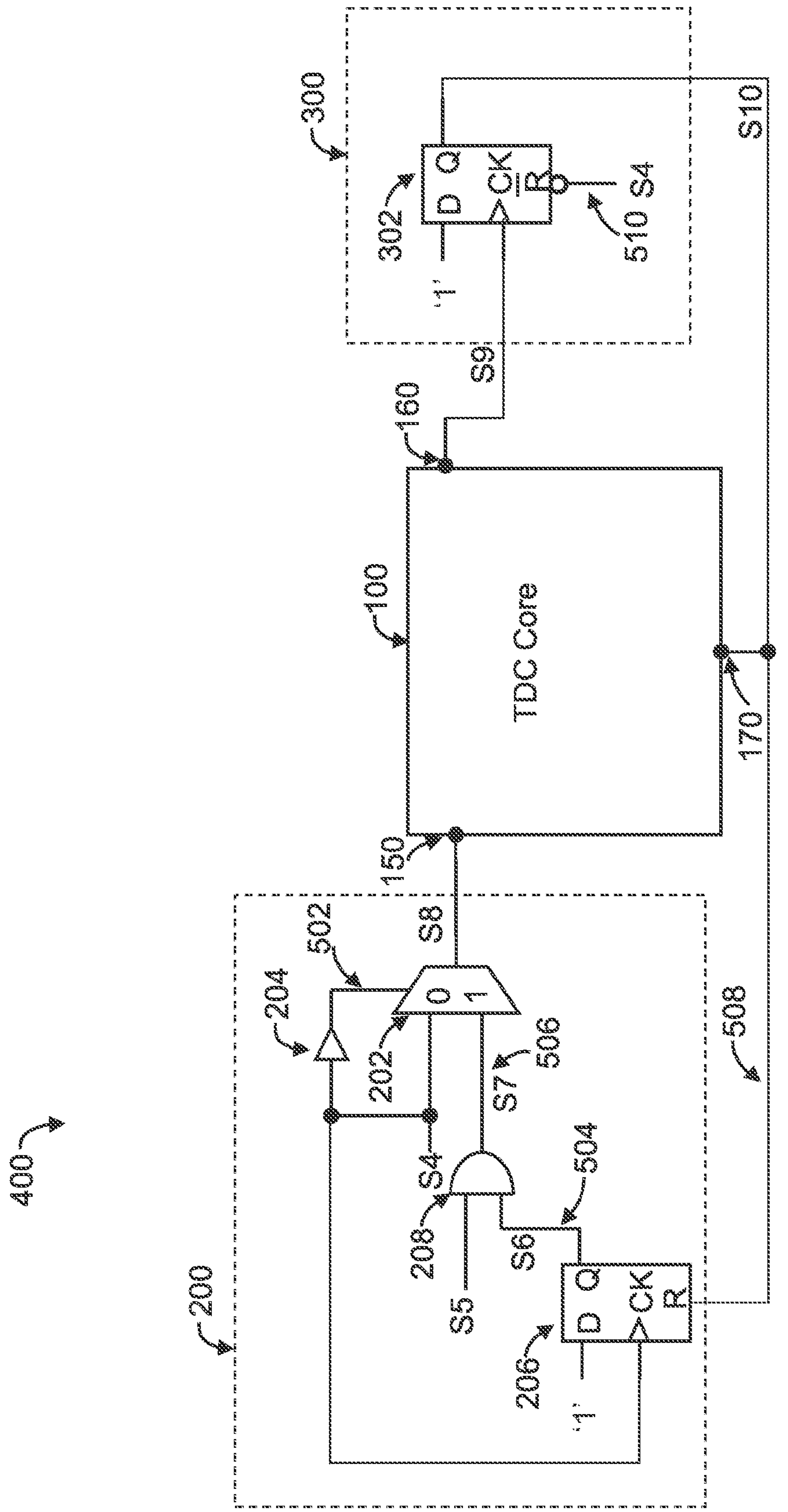
FIG. 4 illustrates a circuit diagram of a power-saving TDC system in accordance with some embodiments.

FIG. 4 illustrates a circuit diagram of the gating circuit 200 and the control circuit 300 of a power-saving TDC system 400 in accordance with some embodiments. The gating circuit 200 includes at least a multiplexer 202, a delay component 204, a flip-flop 206, and an AND gate 208. In some embodiments, the gating circuit 200 is configured to gate at least one of the input signals S4 and S5 as discussed below.

The delay element 204 has an input coupled to the input signal S4 and an output coupled to the select input of the multiplexer 202. The delay component 204 inputs the input signal S4 and generates a delayed input signal S4. The amount of delay that the delay component 204 generates can be configured based on the design of the delay component 204. The delay component 204 may comprise at least two inverters, one or more buffers, the like, or any other components suitable to generate a consistent delay.

The multiplexer 202 has a first input coupled to a signal S4, a second input coupled to an output signal S7 of the AND gate 208, the select input coupled to the output of the delay component 204, and an output coupled to the TDC core 100 at the node 150. The multiplexer 202 selects the appropriate input (first input or second input) based on the value of the select input to forward to an output signal S8. For example, when the select input is a logic low value, the first input (input signal S4) is selected and forwarded to the output signal S8 of the multiplexer 202, and when the select input is a logic high value, the second input (signal S7) is selected and forwarded to the output signal S8 of the multiplexer 202.

The flip-flop 206 of the gating circuit 200 is a D-type flip-flop, and has an input (D), a non-inverting output (Q), a clock input (or, "enable") (CK), and a reset input (R). The input of the flip-flop 206 is coupled to a logic high value (illustrated as a '1' in FIG. 4). The clock input of the flip-flop 206 is coupled to the input signal S4. The output signal S6 generated by the flip-flop 206 from the non-inverting output is coupled to an input of the AND gate 208. The reset input of the flip-flop 206 is coupled to node 170 of the TDC core 100, which is coupled to an output signal S10 of the control circuit 300. In some embodiments, the output is from an inverting output. In some embodiments, the flip-flop 206 captures the logic high value at the input (D) at edges (e.g., rising edges) of the input signal S4. In some embodiments, the output signal S6 of the flip-flop 206 is set to a logic low value when the output signal S10 of the control circuit 300 is a logic high value at the reset input of the flip-flop 206.

The AND gate 208 has a first input coupled to the input signal S5, a second input coupled to the output signal S6 of the flip-flop 206, and the output coupled to the second input of the multiplexer 202. The AND gate 208 generates an output signal S7 based on the values of the first and second inputs (signals S5 and S6). For example, when both the input signal S5 and the signal S6 are a logic high value, the output signal S7 is a logic high value. However, when one or both of the input signal S5 and signal S6 are a logic low value, the output signal S7 is a logic low value.

The control circuit 300 includes at least a flip-flop 302. In some embodiments, the control circuit 300 is configured to: provide a clock signal to the readout circuit of the TDC core 100, activate the gating circuit 200 based on the input signal S4, and/or reset the gating circuit 200 based on the output of the delay line 110 as discussed below.

The flip-flop 302 of the control circuit 300 is a D-type flip-flop, and has an input (D), a non-inverting output (Q), a clock input (or, "enable") (CK), and an inverted reset input ($\overline{R}$). The input of the flip-flop 302 is coupled to a logic high (illustrated as a '1' in FIG. 4). The clock input of the flip-flop 302 is coupled to a signal S9 at the node 160 of the TDC core 100 (see FIG. 1). The output signal S10 generated by the flip-flop 302 from the non-inverting output is coupled to the node 170 of the TDC core 100 (see FIG. 1) and the reset input of the flip-flop 206 of the gating circuit 200. In some embodiments, the output is from an inverting output. The inverted reset input of the flip-flop 302 is coupled to the input signal S4. In some embodiments, the flip-flop 302 captures the logic high value at the input (D) at edges (e.g., rising edges) of the signal S9. In some embodiments, the output signal S10 of the flip-flop 302 is set to a logic low value when the input signal signal S4 is a logic low value at the inverted reset input of the flip-flop 302.

Although the TDC core 100 illustrated in FIG. 1 is a single-ended type of TDC, the power-saving TDC system 400 is also applicable to differential type TDC systems.

Figure 5:
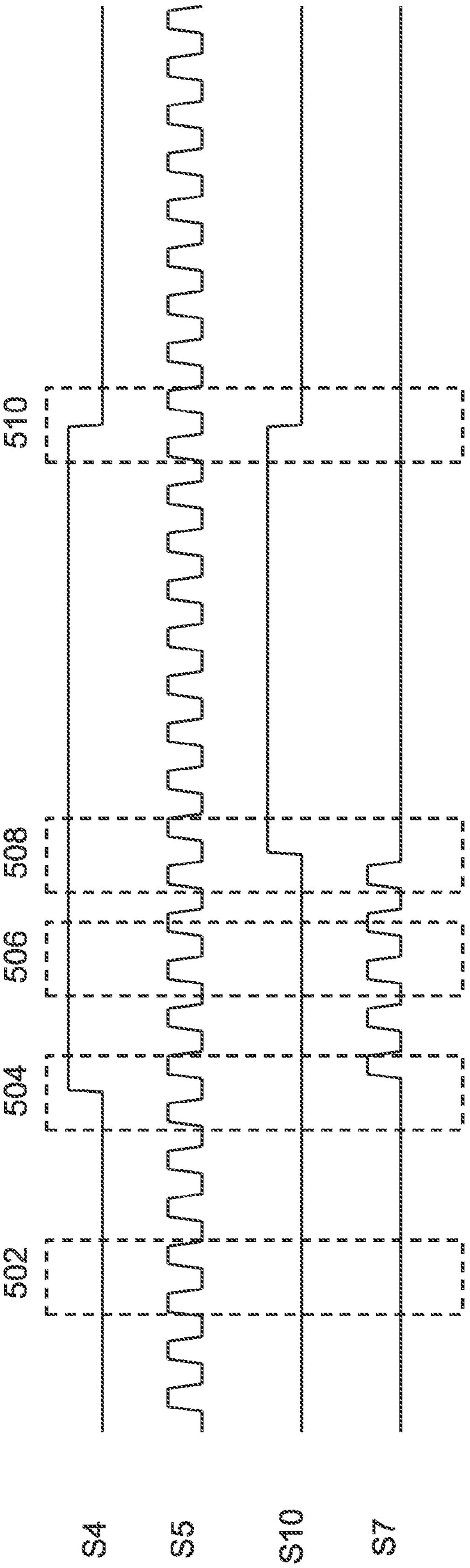
FIG. 5 is a waveform diagram illustrating operation of the power-saving TDC system in accordance with some embodiments.

FIG. 5 is a waveform diagram illustrating operation of the power-saving TDC system 400 in accordance with some embodiments. The signals included in the waveform diagram are the input signals S4 and S5, the output signal S10 of the control circuit 300, and the output signal S7 of the AND gate 208 which is also the second input of the multiplexer 202. The input signals S4 and S5 are similar to the input signals S0 and S1 described above and the descriptions are not repeated herein. For example, the signal S4 could be a reference signal and the input signal S5 could be a feedback signal.

The waveform diagram in FIG. 5 includes reference points 502, 504, 506, 508, and 510 and the circuit diagram in FIG. 4 includes corresponding reference points 502, 504, 506, 508, and 510 to aid in the discussion of FIGS. 4 and 5. The reference points 502-510 are used to illustrate the relationship between FIGS. 4 and 5 at certain points in time, but are not meant to be limiting to which components or signals in the circuit diagram are active or changing at any given reference point.

At reference point 502, the input signal S4 is a logic low value and the input signal S5 is periodically oscillating between a logic low value and a logic high value. The logic low value of input signal S4 on the select input of the multiplexer 202 causes the multiplexer to select and forward the logic low value of the input signal S4 to the output signal S8 of the multiplexer. Because the signal S8 is a logic low value, the delay line 110 and the readout circuit 120 (see FIG. 1) coupled to the node 150 are powered down and not actively inverting and latching signals. The output signal S10 of the control circuit is also logic low value because input signal S4 at the inverted reset input of the flip-flop 302 is a logic low value.

At reference point 504, the input signal S4 transitions from a logic low value to a logic high value, which clocks the flip-flop 206 of the gating circuit 200 and generates the output signal S6 of the flip-flop 206 as a logic high value at the second input of the AND gate 208. The logic high value of the output signal S6 activates the gating circuit 200 and as discussed below allows the input signal S5 to pass through the AND gate 208 and the multiplexer 202.

At reference point 506, the output signal S7 of the AND gate 208 mirrors the input signal S5 on the first input of the AND gate 208 because of the logic high value of signal S6 on the second input of the AND gate 208. The multiplexer 202 selects and forwards the second input (signal S7 which is mirroring input signal S5) to the output signal S8 because the delayed input signal S4 coupled to the select input of the multiplexer 202 is a logic high value. In some embodiments, the delay component 204 is designed such that the delay component 204 causes a longer delay of the input signal S4 to the select input of the multiplexer 202 than the delay in the flip-flop 206 latching the logic high value to the output signal S6, which is clocked by the input signal S4. The longer delay of the delay component 204 ensures that the first rising edge on the output signal S8 of the multiplexer 202 is the rising edge of the input signal S4 and not the rising edge of the input signal S5. This allows for the readout circuit 120 of the TDC core 100 to be clocked by the signal S10 which is triggered by the first rising edge of the output signal S8 (e.g., the input signal S4 rising edge) at the clock input of the flip-flop 302 (see reference point 508).

At reference point 508, the first rising edge of the signal S8 passes through the delay line 110 (see FIG. 1) and reaches node 160 to become signal S9 and clocks the flip-flop 302 of the control circuit 300. This causes the output signal S10 to become a logic high value, which clocks the readout circuit 120 at node 170 and resets the gating circuit 200 by resetting the flip-flop 206 of the gating circuit 200. The reset input of the flip-flop 206 being a logic high value causes the output signal S6 of the flip-flop 206 to be a logic low value, which causes the output signal S7 of the AND gate 208 to be a logic low value and the output signal S8 of the multiplexer 202 to be logic low value.

At reference point 510, the input signal S4 transitions from a logic high value to a logic low value, which resets the flip-flop 302 causing the signal S10 to be a logic low value. The output signal S10 of the control circuit 300 being a logic low value enables the gating circuit 200 because the reset input of the flip-flop 206 is coupled to the output signal S10. The logic low value of the input signal S4 also switches the multiplexer 202 to select the input signal S4 on its first input. After reference point 510, the TDC core 100 is powered down again and the gating circuit 200 and the control circuit 300 are enabled and ready for the next rising edge of the input signal S4.

By designing the gating circuit 200 and the control circuit 300 to only pass through the input signals S4 and S5 for the small window of time needed for the TDC core to determine the time information of the input signals S4 and S5, the power required of the TDC core 100 is greatly reduced because the inverters of the delay line 110 are not constantly powered and changing their output values and the flip-flops of the readout circuit 120 are not constantly latching in new input values. In some embodiments, the power-saving TDC system 400 can reduce the average current required by about 90% as compared to a TDC system without the gating circuit 200 and the control circuit 300. For example, in an experiment with an input signal S4 having a frequency of about 100 megahertz and an input signal S5 having a frequency of about 3 gigahertz, the power-saving TDC system 400 had an average current consumption of about 0.298 milliamps while a TDC system without the gating circuit 200 and the control circuit 300 had an average current consumption of about 2.631 milliamps.

Figure 6:
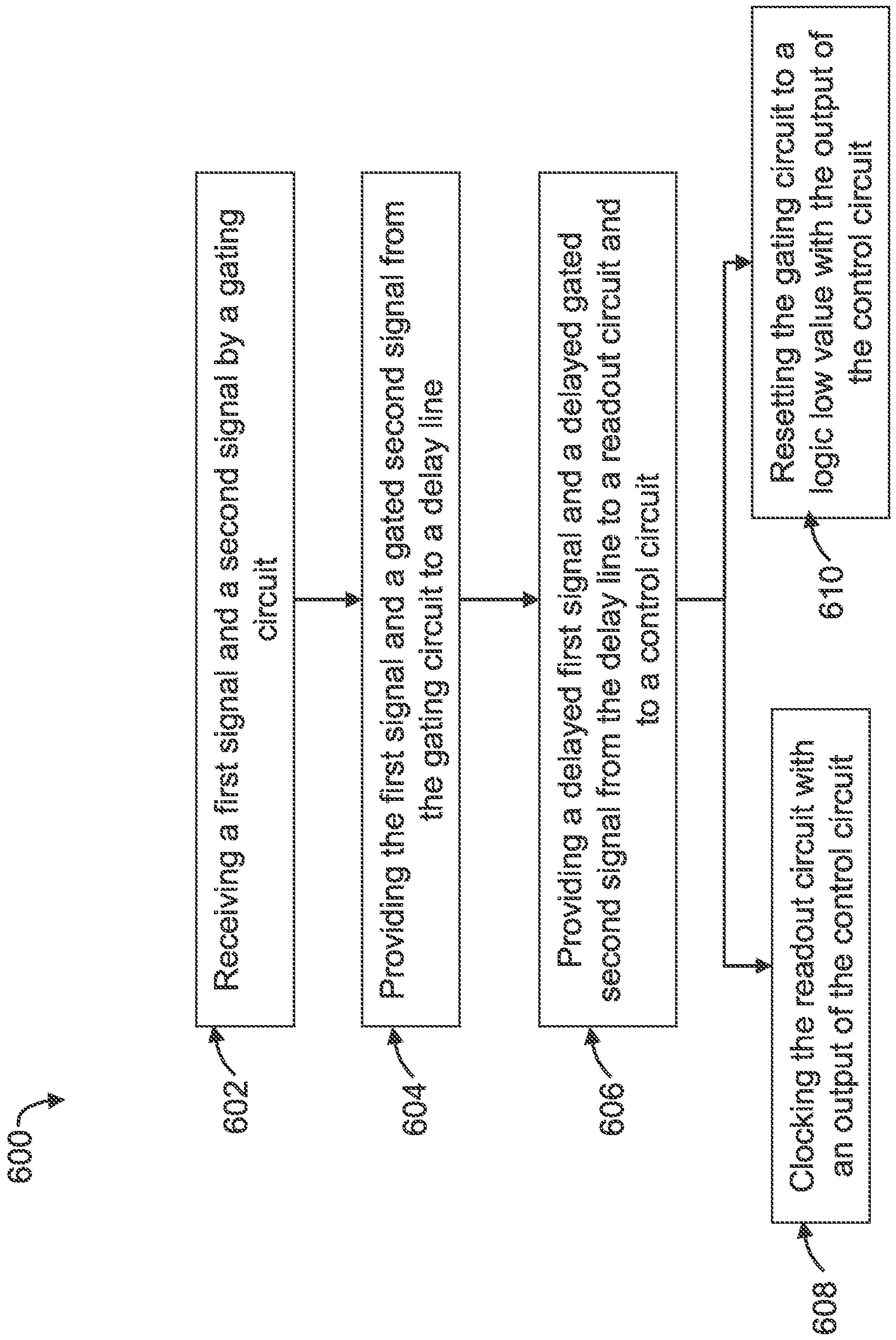
FIG. 6 illustrates a method of operation of a power-saving TDC system in accordance with some embodiments.

FIG. 6 illustrates a method 600 of operating a power-saving TDC system in accordance with some embodiments. In some embodiments, the method 600 is performed by the power-saving TDC system 400 in FIG. 4. At step 602, a first signal and a second signal, such as signals S4 and S5 in FIG. 4, are received by a gating circuit (e.g., the gating circuit 200). At step 604, the first signal and a gated second signal are provided from the gating circuit to a delay line (e.g. the delay line 110). At step 606, a delayed first signal and a delayed gated second signal are provided from the delay line to a readout circuit (e.g. the readout circuit 120) and to a control circuit (e.g. the control circuit 300). At step 608, the readout circuit is clocked with an output (e.g., output signal S10) of the control circuit. At step 610, the gating circuit is reset to a logic low value with the output (e.g. the output signal S10) of the control circuit.

By designing the power-saving TDC system to only pass through the input signals (e.g., input signals S4 and S5) for the small window of time needed for the TDC system to determine the time information of the input signals, the power required of the TDC system is greatly reduced because the delay line is not constantly powered and the flip-flops of the readout circuit are not constantly latching in new input values. It has been found that the power-saving TDC system can reduce the average current required by about 90% as compared to a TDC system without a gating circuit and a control circuit. In addition, the power-saving TDC system functions as described above to automatically power on and off the circuit, regardless of the frequency and phase relationship of the input signals. The gating circuit and the control circuit can be implemented easily with very low power requirements and a minimal layout area.

An embodiment is a device including an control circuit, a time-to-digital converter circuit coupled having a first output coupled to a first input of the control circuit, and a gating circuit having a first input coupled to a first signal, a second input coupled to a second signal, and an output coupled to a first input of the time-to-digital converter circuit, an output of the control circuit coupled to a second input of the time-to-digital converter circuit and to a third input of the gating circuit.

Another embodiment is a circuit including a delay line, a readout circuit coupled to the delay line, and a control circuit having a first input coupled to an output of the delay line and an output coupled to a first input of readout circuit. The circuit further includes a gating circuit having a first input coupled to a first signal, a second input coupled to a second signal, and an output coupled to an input of the delay line, the gating circuit configured to couple the second signal to the output of the gating circuit based on the first signal and the output of the control circuit.

A further embodiment is a method including receiving a first signal and a second signal by a gating circuit, providing the first signal and a gated second signal from the gating circuit to a delay line, and providing a delayed first signal and a delayed gated second signal from the delay line to a readout circuit and to a control circuit. The method further includes clocking the readout circuit with an output of the control circuit, and resetting an output of the gating circuit to a logic low value with the output of the control circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:

a control circuit;

a time-to-digital converter circuit coupled having a first output coupled to a first input of the control circuit; and a gating circuit having a first input coupled to a first signal, a second input coupled to a second signal, and an output coupled to a first input of the time-to-digital converter circuit, an output of the control circuit coupled to a second input of the time-to-digital converter circuit and to a third input of the gating circuit, wherein the gating circuit further comprises:

a first flip-flop comprising:

an input coupled to a logic high value;

a clock input coupled to the first input of the gating circuit; and a reset input coupled to the third input of the gating circuit;

an AND gate comprising:

a first input coupled to the second input of the gating circuit; and a second input coupled to an output of the first flip-flop;

a multiplexer comprising:

a first input coupled to the first input of the gating circuit;

a second input coupled to an output of the AND gate; and an output coupled to the first output of the gating circuit; and a delay component coupled between the first input of the gating circuit and a select input of the multiplexer.

2. The device of claim 1, wherein the time-to-digital converter circuit is a single-ended time-to-digital converter circuit.

3. The device of claim 1, wherein the time-to-digital converter circuit is a differential time-to-digital converter circuit.

4. The device of claim 1, wherein the time-to-digital converter circuit further comprises:

a delay line with an input coupled to the first input of the time-to-digital converter circuit and an output coupled to the first output of the time-to-digital converter circuit; and a readout circuit coupled between the delay line and the second input of the time-to-digital converter circuit.

5. The device of claim 1, wherein the control circuit is configured to provide a clock signal to the time-to-digital converter circuit.

6. The device of claim 1, wherein the control circuit is configured to activate the gating circuit based on the first signal.

7. The device of claim 1, wherein the control circuit is configured to reset the gating circuit based on the first output of the time-to-digital converter circuit.

8. The device of claim 1, wherein the first signal is a reference signal and the second signal is a feedback signal.

9. The device of claim 1, wherein the control circuit further comprises:

a second flip-flop comprising:

an input coupled to a logic high value;

a clock input coupled to the first input of the control circuit;

an output coupled to the output of the control circuit; and a reset input coupled to the first signal.

10. A circuit comprising:

a delay line;

a readout circuit comprising at least one flip-flop, the delay line being coupled to a data input of the at least one flip-flop of the readout circuit;

a control circuit having a first input coupled to an output of the delay line and an output coupled to a clock input of the at least one flip-flop of the readout circuit; and a gating circuit having a first input coupled to a first signal, a second input coupled to a second signal, and an output coupled to an input of the delay line, the gating circuit configured to couple the second signal to the output of the gating circuit based on the first signal and the output of the control circuit.

11. The circuit of claim 10, wherein the first and second signals are periodic signals.

12. The circuit of claim 10, wherein the gating circuit is further configured to couple the second signal to the output of the gating circuit when the first signal is a logic high value and the output of the control circuit is a logic low value.

13. The circuit of claim 10, wherein the delay line further comprises at least one inverter having an input coupled to the input of the delay line, and wherein the at least one flip-flop of the readout circuit further comprises:

a first flip-flop having an input coupled to the input of the delay line and a clock input coupled to the output of the control circuit; and a second flip-flop having an input coupled to an output of the inverter and a clock input coupled to the output of the control circuit.

14. The circuit of claim 10, wherein the output of the control circuit is configured to reset the gating circuit to provide a logic low value to the output of the gating circuit.

15. The circuit of claim 10, wherein the gating circuit further comprises:

a multiplexer comprising:

a first input coupled to the first signal;

a second input coupled to a gated second signal;

a select input coupled to a delayed first signal; and an output coupled to the output of the gating circuit.

16. A method comprising:

receiving a first signal and a second signal by a gating circuit;

providing the first signal and a gated second signal from the gating circuit to a delay line;

providing a delayed first signal and a delayed gated second signal from the delay line to a readout circuit and to a control circuit, the readout circuit comprising at least one flip-flop;

clocking the at least one flip-flop of the readout circuit with an output of the control circuit; and resetting an output of the gating circuit to a logic low value with the output of the control circuit.

17. The method of claim 16 further comprising:

clocking the gating circuit with the first signal.

18. The method of claim 16 further comprising:

resetting the output of the control circuit to a logic low value with the first signal.

19. The method of claim 16 further comprising:

determining a phase difference between the first signal and the second signal based on readout signals from the readout circuit.

20. The method of claim 16, wherein providing the first signal and the gated second signal from the gating circuit to the delay line comprises:

starting to provide the first signal and the gated second signal to the delay line when a transition of the first signal is detected; and stopping to provide the first signal and the gated second signal to the delay line when a transition of the output of the control circuit is detected.

* * * * *